(12) United States Patent
Xu

(10) Patent No.: US 9,887,389 B2
(45) Date of Patent: Feb. 6, 2018

(54) ORGANIC LIGHT EMITTING DEVICE

(71) Applicant: SHENZHEN CHINA STAR OPTOELECTRONICS TECHNOLOGY CO., LTD., Shenzhen, Guangdong (CN)

(72) Inventor: Chao Xu, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 143 days.

(21) Appl. No.: 14/893,806

(22) PCT Filed: Sep. 28, 2015

(86) PCT No.: PCT/CN2015/090934
§ 371 (c)(1),
(2) Date: Nov. 24, 2015

(87) PCT Pub. No.: WO2017/049652
PCT Pub. Date: Mar. 30, 2017

(65) Prior Publication Data
US 2017/0256749 A1    Sep. 7, 2017

(30) Foreign Application Priority Data
Sep. 22, 2015    (CN) .......................... 2015 1 0609232

(51) Int. Cl.
H01L 51/52    (2006.01)
H01L 51/50    (2006.01)
H01L 51/56    (2006.01)

(52) U.S. Cl.
CPC ...... *H01L 51/5275* (2013.01); *H01L 51/5056* (2013.01); *H01L 51/5072* (2013.01); *H01L 51/5271* (2013.01); *H01L 51/56* (2013.01)

(58) Field of Classification Search
CPC ............ H01L 51/0545; H01L 51/0036; H01L 51/0541; H01L 51/5012
See application file for complete search history.

(56) References Cited

U.S. PATENT DOCUMENTS

2008/0278067 A1    11/2008  Tyan et al.
2010/0051925 A1*   3/2010   Kho .................... H01L 51/5036
                                                          257/40
(Continued)

FOREIGN PATENT DOCUMENTS

CN    1700826 A     11/2005
CN    101682001 A    3/2010
(Continued)

Primary Examiner — Quoc Hoang
(74) Attorney, Agent, or Firm — Ladas & Parry LLP

(57) ABSTRACT

An organic light emitting device is provided. The organic light emitting device has a mixed light extraction layer, a base substrate, a first light extraction layer, a light-emitting layer, and a second light extraction layer; the first light extraction layer is configured to transmit the light emitted from the light-emitting layer to the base substrate; and the mixed light extraction layer is configured to transmit the emitting light outputted from the base substrate to an air area on the mixed light extraction layer, so as to increase a light utilization of the light-emitting layer.

17 Claims, 3 Drawing Sheets

(56) References Cited

U.S. PATENT DOCUMENTS

| | | | |
|---|---|---|---|
| 2012/0241771 A1* | 9/2012 | Kato | ................... H01L 51/5275 |
| | | | 257/88 |
| 2012/0248970 A1 | 10/2012 | Okuyama et al. | |
| 2013/0341605 A1 | 12/2013 | Yoo et al. | |
| 2014/0042426 A1 | 2/2014 | Nishimura et al. | |
| 2014/0361270 A1 | 12/2014 | Cui et al. | |
| 2015/0177427 A1* | 6/2015 | Morinaka | ........... H01L 51/5268 |
| | | | 362/355 |
| 2015/0228931 A1 | 8/2015 | Lamansky et al. | |
| 2017/0047553 A1* | 2/2017 | Yang | ....................... H01L 51/50 |

FOREIGN PATENT DOCUMENTS

| | | |
|---|---|---|
| CN | 102694128 A | 9/2012 |
| CN | 103490020 A | 1/2014 |
| CN | 103515541 A | 1/2014 |
| CN | 103518422 A | 1/2014 |
| CN | 203690349 U | 7/2014 |
| CN | 104091898 A | 10/2014 |
| CN | 104241543 A | 12/2014 |
| CN | 104362260 A | 2/2015 |
| CN | 104393179 A | 3/2015 |
| CN | 104813500 | 7/2015 |

* cited by examiner

ORGANIC LIGHT EMITTING DEVICE

FIELD OF THE INVENTION

The present invention relates to a technical field of displays, and in particular to an organic light emitting device.

BACKGROUND OF THE INVENTION

An organic light emitting diode display has some advantages, such as self-luminous, a wide viewing angle, fast response, high contrast and low energy consumption, which could be a focus of the next generation display technology.

Refer to FIG. 1, which is a schematic view of a traditional organic light emitting diode display; the organic light emitting diode display has a base substrate 10, an anode layer 11 located under the base substrate 10, a light-emitting layer 12 located under the anode layer 11, and a cathode layer 13 located under the light-emitting layer 12. However, a light generated from the light-emitting layer 12 is affected by reflection and refraction of the anode layer 11, the base substrate 10, and an air layer, so that most of the light escapes from the side of the organic light emitting diode display, and the light utilization is reduced to limit the development of the organic light emitting diode display.

Therefore, an organic light emitting device needs to be developed which solves the problems existing in the conventional art as described above.

SUMMARY OF THE INVENTION

An object of the present invention is to provide an organic light emitting device, which solves the problems that the light utilization is too low.

To achieve the above object, the present invention is described as follows:

The present invention provides an organic light emitting device which comprises:

a base substrate;

a mixed light extraction layer located on the base substrate, and comprising a second light extraction layer and a third light extraction layer located on the second light extraction layer, wherein a refractive index of a material of the third light extraction layer is smaller than that of the base substrate, and the refractive index of the material of the base substrate is smaller than that of the second light extraction layer;

a first light extraction layer located under the base substrate;

a first electrode layer located under the first light extraction layer and configured to output holes by voltage driving;

a light-emitting layer located under the first electrode layer and configured to generate a light by an excitation of the holes of the first electrode layer and electrons of an electrode layer; and the second electrode layer located under the light-emitting layer and configured to output the electrons by voltage driving;

wherein the first light extraction layer is configured to transmit the light emitted from the light-emitting layer to the base substrate; the mixed light extraction layer is configured to transmit the emitting light outputted from the base substrate to an air area on the mixed light extraction layer, so as to increase a light utilization of the light-emitting layer; and a refractive index of a material of the first light extraction layer is greater than that of the first electrode layer.

In one embodiment of the present invention, a cross section of the second light extraction layer is zigzag-shaped.

In one embodiment of the present invention, the cross section of the second light extraction layer comprises a plurality of first triangular units, each of the first triangular units includes two first bottom corners and a first top corner, and an angle of each of the first bottom corners is defined according to the refractive index of the material of the second light extraction layer.

In one embodiment of the present invention, a cross section of the first light extraction layer is zigzag-shaped.

In one embodiment of the present invention, the cross section of the first light extraction layer comprises a plurality of second triangular units, each of the second triangular units includes two second bottom corners and a second top corner, and an angle of each of the second bottom corners is defined according to the refractive index of the material of the first light extraction layer.

In one embodiment of the present invention, the material of the first light extraction layer is zinc oxide or titanium dioxide.

In one embodiment of the present invention, the materials of the first light extraction layer and the mixed light extraction layer are transparent materials.

In one embodiment of the present invention, the organic light emitting device further comprises a reflective layer located under the second electrode layer.

To achieve the above object, the present invention provides an organic light emitting device which comprises:

a base substrate;

a mixed light extraction layer located on the base substrate;

a first light extraction layer located under the base substrate;

a first electrode layer located under the first light extraction layer and configured to output holes by voltage driving;

a light-emitting layer located under the first electrode layer and configured to generate a light by an excitation of the holes of the first electrode layer and electrons of a second electrode layer; and the second electrode layer located under the light-emitting layer and configured to output the electrons by voltage driving;

wherein the first light extraction layer is configured to transmit the light emitted from the light-emitting layer to the base substrate; and the mixed light extraction layer is configured to transmit the light outputted from the base substrate to an air area on the mixed light extraction layer, so as to increase a light utilization of the light-emitting layer.

In one embodiment of the present invention, a refractive index of a material of the first light extraction layer is greater than that of the first electrode layer.

In one embodiment of the present invention, the mixed light extraction layer comprises a second light extraction layer and a third light extraction layer located on the second light extraction layer, a refractive index of a material of the third light extraction layer is smaller than that of the base substrate, and the refractive index of the material of the base substrate is smaller than that of the second light extraction layer.

In one embodiment of the present invention, a cross section of the second light extraction layer is zigzag-shaped.

In one embodiment of the present invention, the cross section of the second light extraction layer comprises a plurality of first triangular units, each of the first triangular units includes two first bottom corners and a first top corner, and an angle of each of the first bottom corners is defined according to the refractive index of the material of the second light extraction layer.

In one embodiment of the present invention, a cross section of the first light extraction layer is zigzag-shaped.

In one embodiment of the present invention, the cross section of the first light extraction layer comprises a plurality of second triangular units, each of the second triangular units includes two second bottom corners and a second top corner, and an angle of each of the second bottom corners is defined according to the refractive index of the material of the first light extraction layer.

In one embodiment of the present invention, the material of the first light extraction layer is zinc oxide or titanium dioxide.

In one embodiment of the present invention, the materials of the first light extraction layer and the mixed light extraction layer are transparent materials.

In one embodiment of the present invention, the organic light emitting device further comprises a reflective layer located under the second electrode layer.

According to the organic light emitting device of the present invention, the light extraction layers are configured on opposite sides of the base substrate respectively to transmit the light emitted from the light-emitting layer to the base substrate, and the emitting light is outputted from the base substrate to the display area, so as to increase a light utilization of the light-emitting layer.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

Figure 1:
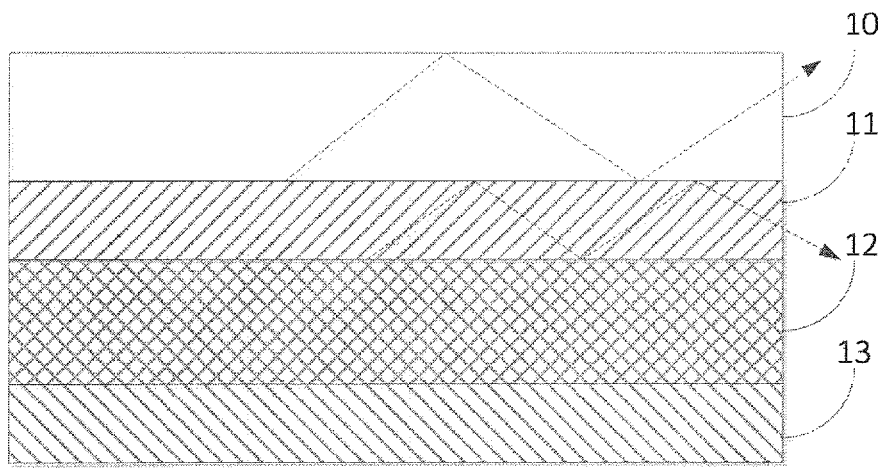
FIG. 1 is a schematic view of a traditional organic light emitting diode display.
Figure 2:
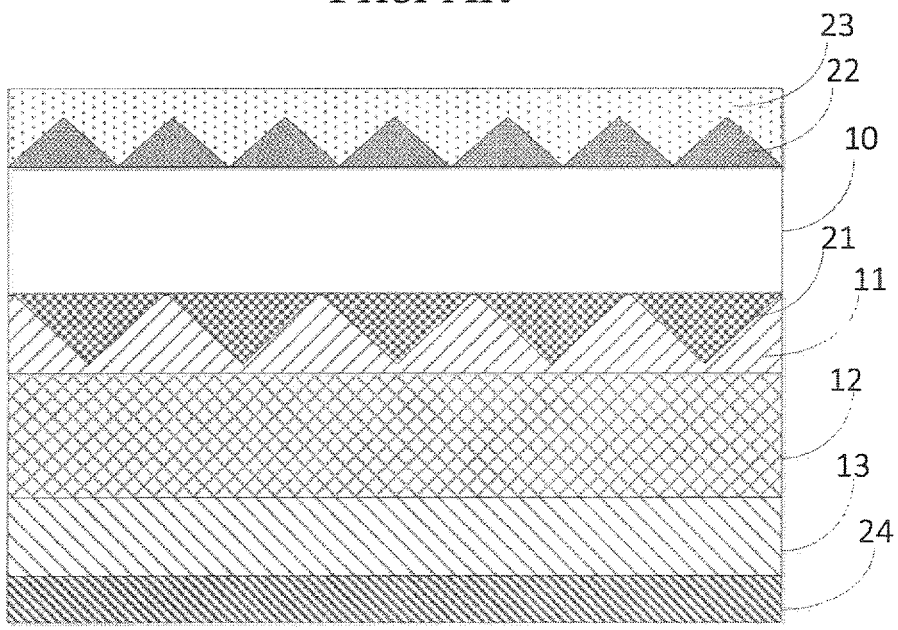
FIG. 2 is a schematic view of an organic light emitting device of the present invention.

Refer to FIG. 2, which is a schematic view of an organic light emitting device of the present invention.

Referring to FIG. 2; the organic light emitting device comprises a base substrate 10, a mixed light extraction layer, a first light extraction layer 21, a first electrode layer 11, a light-emitting layer 12, and a second electrode layer 13.

For example, the base substrate 10 is a glass substrate; the mixed light extraction layers 22, 23 are located on the base substrate 10; and the first light extraction layer 21 is located under the base substrate 10.

The first electrode layer 11 is located under the first light extraction layer 21; the first electrode layer 11, such as an anode, is configured to output holes by voltage driving; for example, the anode is a transparent conductive film.

The light-emitting layer 12 is located under the first light extraction layer 21; the light-emitting layer 12 is configured to generate a light by an excitation of the holes of the first electrode layer 11 and electrons of the second electrode layer 13; when the voltage is injected into the holes of the anode to combine with the electrons of the cathode in the light-emitting layer 12, the organic material is excited to emit the light; for example, the material of the light-emitting layer 12 is tris (8-hydroxyquinoline) aluminum; the second electrode layer 13 is located under the light-emitting layer 12; for example, the second electrode layer 13 is a cathode, such as Mg/Ag alloy, and the second electrode layer 13 outputs the electrons by voltage driving.

The organic light emitting device further comprises a hole transmitter layer and the electron transmitter layer; the hole transmitter layer is located between the first electrode layer 11 and the light-emitting layer 12; the electron transmitter layer is located between the light-emitting layer 12 and the second electrode layer 13; and the material of the hole transmitter layer is triarylamine.

The first light extraction layer 21 is configured to transmit the light emitted from the light-emitting layer 12 to the base substrate 10; the mixed light extraction layer is configured to transmit the emitting light outputted from the base substrate 10 to a display area (an air area on/over the mixed light extraction layer), so as to increase a light utilization of the light-emitting layer 12.

Preferably, a reflective layer 24, which is made of aluminum, is further located under the second electrode layer 13, used for transmitting the light under the light-emitting layer 12 to an area on/over the light-emitting layer 12, so that the light utilization of the light-emitting layer is increased.

Preferably, the mixed light extraction layer comprises a second light extraction layer 22 and a third light extraction layer 23; the third light extraction layer 23 is located on the second light extraction layer 22.

Preferably, a refractive index of a material of the first light extraction layer 21 is greater than that of the first electrode layer 11; a refraction of the incident light is stronger if a refractive index of the material is greater; when the above-mentioned relationship is satisfied, the light on the first electrode layer can be transmitted more to the base substrate.

Preferably, a cross section of the first light extraction layer 21 is zigzag/prism-shaped; the refraction of the light on the zigzag-shaped layer is better than that of a light extraction layer with other shapes; Thus, the refraction of the first electrode layer can be increased when the first electrode layer first light extraction layer 21 is zigzag-shaped.

Preferably, the cross section of the first light extraction layer 21 comprises a plurality of second triangular units (such as triangular zigzags/prisms), each of the second triangular units includes two second bottom corners and a second top corner; an angle of each of the second bottom corners is defined according to the refractive index of the material of the first light extraction layer; the bottom corner of the triangular zigzag needs to be defined according to the refractive index of the material of the first light extraction layer 21, so that the refractive index of the material of the first light extraction layer 21 is greater than that of the first electrode layer.

Preferably, the material of the first light extraction layer 21 is zinc oxide or titanium dioxide; the refractive index of zinc oxide or titanium dioxide is greater and able to increase the refraction of the first light extraction layer 21.

Preferably, the materials of the first light extraction layer 21 and the mixed light extraction layer are transparent materials, so that the light generated from the light-emitting layer is emitted to the air area.

Preferably, a refractive index of a material of the second light extraction layer 22 is greater than that of the base substrate 10; a refractive index of a material of the base substrate 10 is greater than that of the third light extraction layer 23; the emitting light outputted from the base substrate can be transmitted more to the second light extraction layer 22 when the refractive index of the material of the second light extraction layer 22 is greater than that of the base substrate 10; the emitting light outputted from the second light extraction layer 22 can be transmitted more to an air area on the mixed light extraction layer, i.e. a display area, when the refractive index of the material of the base substrate 10 is greater than that of the third light extraction layer 23, so as to increase a light utilization of the light-emitting layer.

Preferably, a cross section of the second light extraction layer 22 is zigzag/prism-shaped; the refraction of the light on the zigzag-shaped layer is better than that of a light extraction layer with other shapes; Thus, the refraction of the base substrate can be increased when the second electrode layer first light extraction layer 22 is zigzag-shaped.

Preferably, the cross section of the second light extraction layer 22 comprises a plurality of first triangular units (such as triangular zigzags/prisms), each of the first triangular units includes two first bottom corners and a first top corner; an angle of each of the first bottom corners is defined according to the refractive index of the material of the second light extraction layer; the bottom corner of the triangular zigzag needs to be defined according to the refractive index of the material of the second light extraction layer 22, so that the refractive index of the material of the second light extraction layer 22 is greater than that of the first electrode layer.

A manufacturing method of the organic light emitting device of the present invention comprises the steps of:

Step S101, an entire second light extraction layer 22' is formed on a base substrate 10.

Figure 3:
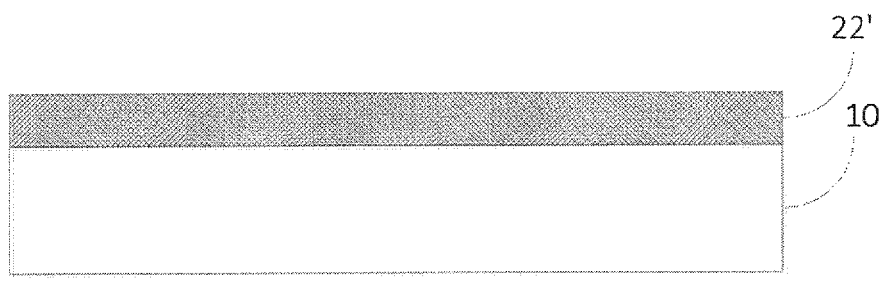
FIG. 3 is a schematic view in a first step of a manufacturing method of the organic light emitting device of the present invention.

Refer to FIG. 3; for example, the entire second light extraction layer 22' is formed on the base substrate 10 by coating.

Step S102, a zigzag-shaped second light extraction layer 22 is formed by performing a patterning process on the second light extraction layer 22'.

Figure 4:
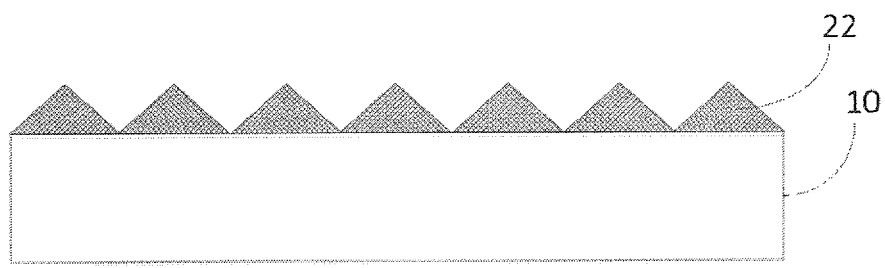
FIG. 4 is a schematic view in a second step of the manufacturing method of the organic light emitting device of the present invention.

Refer to FIG. 4; for example, the zigzag-shaped second light extraction layer 22 is formed by imprinting the second light extraction layer 22'.

Step S103, a third light extraction layer 23 is formed on the zigzag-shaped second light extraction layer 22.

Figure 5:
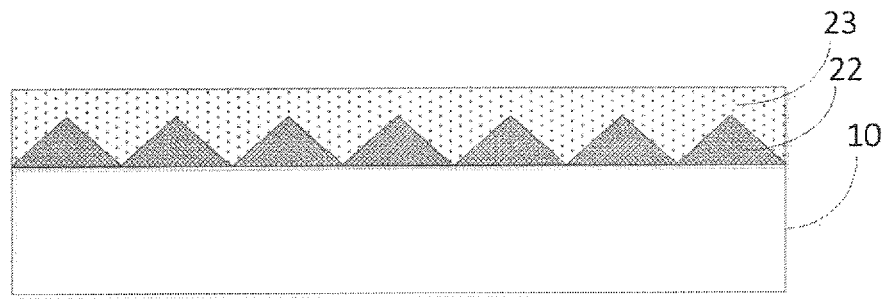
FIG. 5 is a schematic view in a third step of the manufacturing method of the organic light emitting device of the present invention.

Refer to FIG. 5; the third light extraction layer 23 is formed on the zigzag-shaped second light extraction layer 22 by coating, so as to form a mixed light extraction layer.

Step S104, an entire first light extraction layer 21' is formed under the base substrate 10.

Figure 6:
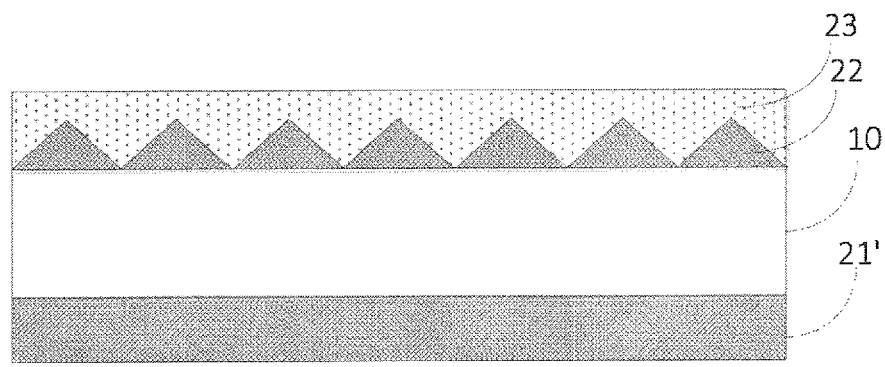
FIG. 6 is a schematic view in a fourth step of the manufacturing method of the organic light emitting device of the present invention.

Refer to FIG. 6; for example, the entire first light extraction layer 21' is formed under the base substrate 10 by coating.

Step S105, a zigzag-shaped first light extraction layer 21 is formed by performing a patterning process on the first light extraction layer 21'.

Figure 7:
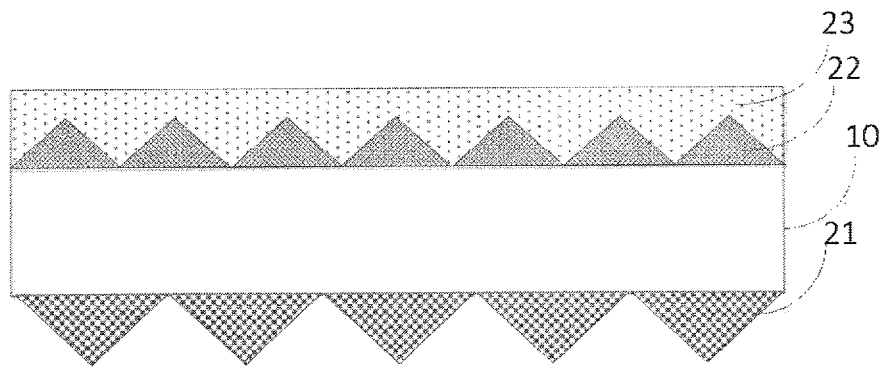
FIG. 7 is a schematic view in a fifth step of the manufacturing method of the organic light emitting device of the present invention.

Refer to FIG. 7; for example, the zigzag-shaped first light extraction layer 21 is formed by imprinting the first light extraction layer 21'.

Step S106, a first electrode layer 11 is formed on the zigzag-shaped first light extraction layer 21.

Figure 8:
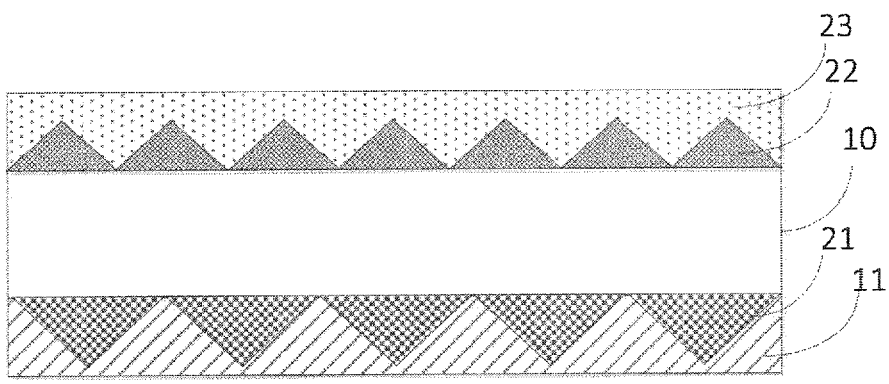
FIG. 8 is a schematic view in a sixth step of the manufacturing method of the organic light emitting device of the present invention.

Refer to FIG. 8; for example, a material of the first electrode layer 11 is indium tin oxide.

Step S107, a light-emitting layer is formed under the first electrode layer 11.

Figure 9:
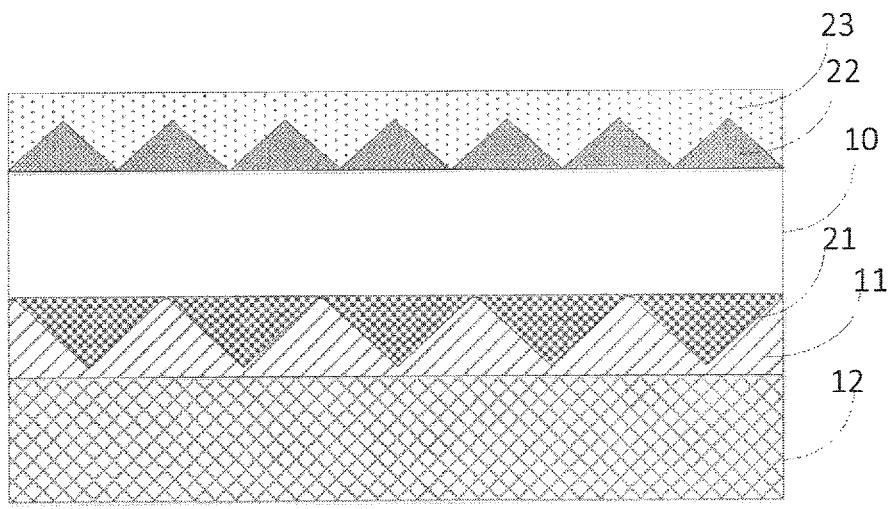
FIG. 9 is a schematic view in a seventh step of the manufacturing method of the organic light emitting device of the present invention.

Refer to FIG. 9; for example, a material of the light-emitting layer is tris (8-hydroxyquinoline) aluminum.

Step S108, a second electrode layer 13 and a reflective layer 24 are formed under the light-emitting layer.

Refer to FIG. 2; the second electrode layer 13 is located under the light-emitting layer; for example, the second electrode layer 13 is a cathode, such as Mg/Ag alloy.

According to the organic light emitting device of the present invention, the light extraction layers are configured on two opposite sides of the base substrate respectively to transmit the light emitted from the light-emitting layer to the base substrate, and the emitting light is outputted from the base substrate to the display area, so as to increase a light utilization of the light-emitting layer.

The present invention has been described with a preferred embodiment thereof and it is understood that many changes and modifications to the described embodiment can be carried out without departing from the scope and the spirit of the invention that is intended to be limited only by the appended claims.

What is claimed is:

1. An organic light emitting device, comprising:
    a base substrate;
    a mixed light extraction layer located on the base substrate, and comprising a second light extraction layer and a third light extraction layer located on the second light extraction layer, wherein a refractive index of a material of the third fight extraction layer is smaller than that of the base substrate, and the refractive index of the material of the base substrate is smaller than that of the second fight extraction layer;
    a first light extraction layer located under the base substrate;
    a first electrode layer located under the first light extraction layer and configured to output holes by voltage driving;
    a light-emitting layer located under the first electrode layer and configured to generate a light by an excitation of the holes of the first electrode layer and electrons of an electrode layer; and
    a second electrode layer located under the light-emitting layer and configured to output the electrons by voltage driving;
    wherein the first light extraction layer is configured to transmit the light emitted from the light-emitting layer to the base substrate; the mixed light extraction layer is configured to transmit the emitting light outputted from the base substrate to an air area on the mixed light extraction layer, so as to increase a light utilization of the light-emitting layer; and a refractive index of a material of the first light extraction layer is greater than that of the first electrode layer.

2. The organic light emitting device according to claim 1, wherein a cross section of the second light extraction layer is zigzag-shaped.

3. The organic light emitting device according to claim 2, wherein the cross section of the second light extraction layer comprises a plurality of first triangular units, each of the first triangular units includes two first bottom corners and a first top corner, and an angle of each of the first bottom corners is defined according to the refractive index of the material of the second light extraction layer.

4. The organic light emitting device according to claim 1, wherein a cross section of the first light extraction layer is zigzag-shaped.

5. The organic light emitting device according to claim 4, wherein the cross section of the first light extraction layer comprises a plurality of second triangular units, each of the second triangular units includes two second bottom corners and a second top corner, and an angle of each of the second bottom corners is defined according to the refractive index of the material of the first light extraction layer.

6. The organic light emitting device according to claim 1, wherein the material of the first light extraction layer is zinc oxide or titanium dioxide.

7. The organic light emitting device according to claim 1, wherein the materials of the first light extraction layer and the mixed light extraction layer are transparent materials.

8. The organic light emitting device according to claim 1, wherein the organic light emitting device further comprises a reflective layer located under the second electrode layer.

9. An organic light emitting device, comprising:
base substrate;
a mixed light extraction layer located on the base substrate;
a first light extraction layer located under the base substrate;
a first electrode layer located under the first light extraction layer and configured to output holes by voltage driving;
a light-emitting layer located under the first electrode layer and configured to generate a light by an excitation of the holes of the first electrode layer and electrons of a second electrode layer; and
the second electrode layer located under the light-emitting layer and configured to output the electrons by voltage driving;

wherein the first light extraction layer is configured to transmit the light emitted from the light-emitting layer to the base substrate; and the mixed light extraction layer is configured to transmit the light outputted from the base substrate to an air area on the mixed light extraction layer, so as to increase a light utilization of the light-emitting layer;

wherein the mixed light extraction layer comprises a second light extraction layer and a third light extraction layer located on the second light extraction layer, a refractive index of a material of the third light extraction layer is smaller than that of the base substrate, and the refractive index of the material of the base substrate is smaller than that of the second light extraction layer.

10. The organic light emitting device according to claim 9, wherein a refractive index of a material of the first light extraction layer is greater than that of the first electrode layer.

11. The organic light emitting device according to claim 9, wherein a cross section of the second light extraction layer is zigzag-shaped.

12. The organic light emitting device according to claim 11, wherein the cross section of the second light extraction layer comprises a plurality of first triangular units, each of the first triangular units includes two first bottom corners and a first top corner, and an angle of each of the first bottom corners is defined according to the refractive index of the material of the second light extraction layer.

13. The organic light emitting device according to claim 9, wherein a cross section of the first light extraction layer is zigzag-shaped.

14. The organic light emitting device according to claim 13, wherein the cross section of the first light extraction layer comprises a plurality of second triangular units, each of the second triangular units includes two second bottom corners and a second top corner, and an angle of each of the second bottom corners is defined according to the refractive index of the material of the first light extraction layer.

15. The organic light emitting device according to claim 9, wherein the material of the first light extraction layer is zinc oxide or titanium dioxide.

16. The organic light emitting device according to claim 9, wherein the materials of the first light extraction layer and the mixed light extraction layer are transparent materials.

17. The organic light emitting device according to claim 9, wherein the organic light emitting device further comprises a reflective layer located under the second electrode layer.

* * * * *